United States Patent
Zhou et al.

(10) Patent No.: US 8,989,307 B2
(45) Date of Patent: Mar. 24, 2015

(54) POWER AMPLIFIER SYSTEM INCLUDING A COMPOSITE DIGITAL PREDISTORTER

(71) Applicant: QUALCOMM Incorporated, San Diego, CA (US)

(72) Inventors: Hao Zhou, Sunnyvale, CA (US); Ning Zhang, Saratoga, CA (US)

(73) Assignee: QUALCOMM Incorporated, San Diego, CA (US)

( * ) Notice: Subject to any disclaimer, the term of this patent is extended or adjusted under 35 U.S.C. 154(b) by 7 days.

(21) Appl. No.: 13/786,406

(22) Filed: Mar. 5, 2013

(65) Prior Publication Data

US 2014/0254716 A1 Sep. 11, 2014

(51) Int. Cl.
*H04K 1/02* (2006.01)
*H04L 25/03* (2006.01)
(Continued)

(52) U.S. Cl.
CPC ............ *H04B 1/0475* (2013.01); *H03F 1/3247* (2013.01); *H03F 1/3258* (2013.01); *H03F 1/3294* (2013.01); *H04B 2001/0425* (2013.01)
USPC ........ 375/297; 375/296; 375/221; 455/114.3; 330/304; 330/293; 330/291; 330/294

(58) Field of Classification Search
CPC ..... H04L 1/243; H04L 1/0001; H04L 1/0009; H04L 1/1854; H04L 27/368; H04L 25/03343; H03F 1/3247; H03F 1/3294; H03F 2201/3233; H03F 3/24; H03F 1/3241; H03F 1/34; H03F 3/343; H03F 2200/294; H03F 3/50; H03F 1/22; H03F 1/56; H03F 1/347; H03F 3/19; H03F 1/48; H03F 1/083; H03F 3/45197; H03F 2203/4572; H03F 3/45183; H03F 1/36; H03F 1/42; H03F 1/08; H03F 3/45475; H03F 11/126; H03G 3/3042; H03G 5/025; H03H 3/45183; H03H 11/26; H04B 1/0475; H04B 2001/0425; H04B 3/145
USPC ........ 375/296, 297, 221; 455/114.3; 330/304, 330/293, 291, 294, 75, 109
See application file for complete search history.

(56) References Cited

U.S. PATENT DOCUMENTS 7,822,146 B2 10/2010 Copeland
8,000,661 B2 8/2011 Chiu et al.
(Continued)

FOREIGN PATENT DOCUMENTS

CN 100452644 C 1/2009
WO WO-2005124995 A1 12/2005

OTHER PUBLICATIONS

Ba, Seydou Nourou, "Efficient Digital Baseband Predistortion for Modern Wireless Handsets," Thesis, Georgia Institute of Technology, Dec. 2009, 133 pages.

(Continued)

*Primary Examiner* — Phuong Phu
(74) *Attorney, Agent, or Firm* — Holland & Hart LLP

(57) ABSTRACT

A power amplifier system including a composite digital predistorter (DPD) ensuring optimized linearity for the power amplifier is described. In this system, a digital-to-analog converter (DAC), an analog filter, a first mixer, and the power amplifier are serially coupled to the composite DPD. A second mixer, a receive gain block, and an analog-to-digital converter (ADC) are serially coupled to the output of the power amplifier. A DPD training component is coupled between the inputs of the composite DPD and the ADC. The composite DPD includes a memory-based DPD, e.g., a memory polynomial (MP) DPD, a memoryless-linearizing DPD, e.g., a look-up table (LUT) DPD, and two multiplexers.

25 Claims, 3 Drawing Sheets

(51) Int. Cl.
  *H04L 25/49* (2006.01)
  *H04B 1/04* (2006.01)
  *H03F 1/32* (2006.01)

(56) References Cited

U.S. PATENT DOCUMENTS

| | | |
|---|---|---|
| 8,055,217 B2 | 11/2011 | Ba et al. |
| 8,509,347 B2 * | 8/2013 | Kim et al. .................... 375/296 |
| 2003/0063686 A1 * | 4/2003 | Giardina et al. ............ 375/296 |
| 2003/0207680 A1 | 11/2003 | Yang et al. |
| 2003/0222712 A1 * | 12/2003 | Kim et al. .................... 330/149 |
| 2004/0179629 A1 | 9/2004 | Song et al. |
| 2005/0163268 A1 | 7/2005 | McCallister |
| 2005/0258898 A1 | 11/2005 | Hongo |
| 2011/0080216 A1 | 4/2011 | Mujica et al. |

OTHER PUBLICATIONS

ISA/EPO, Partial International Search Report of the International Searching Authority, Int'l. App. No. PCT/US2014/019282, Jun. 13, 2014, European Patent Office, Rijswijk, NL, 5 pages.

ISA/EPO, International Search Report and Written Opinion of the International Searching Authority, Int'l App. No. PCT/US2014/019282, Oct. 17, 2014, European Patent Office, Rijswijk, NL, 16 pgs.

* cited by examiner

POWER AMPLIFIER SYSTEM INCLUDING A COMPOSITE DIGITAL PREDISTORTER

BACKGROUND

The invention relates generally to radio frequency (RF) power amplifier systems, and in particular to an RF power amplifier system including cascaded digital predistorters (DPD) for correcting both memory and memoryless amplifier distortions.

RELATED ART

In implementing many communication standards (e.g., IEEE protocol standard 802.11ac), complex modulations with significant envelope variation to increase data rate and/or to separate users may be used. The non-linear behavior of RF power amplifiers used in such systems needs to exhibit a high degree of linearity. Non-linear distortions broaden the emission spectrum and generate inter-modulation products between frequencies, with the result that adjacent frequency bands are polluted.

Adaptive predistortion is a technique for providing RF power amplifier linearity, and because the predistortion is implemented digitally, a high degree of precision can be achieved when computing predistortion coefficients. Theoretically, a predistorter is intended to be equivalent to a non-linear circuit with gain expansion response that is an inverse of the RF power amplifier gain compression (i.e., AM/AM) response, and a phase rotation that is the negative of the power amplifier phase rotation (AM/PM). For a practical RF power amplifier this response can be achieved only up to the saturation point of the amplifier. Therefore, the peak-to-average ratio of the input signal will determine how close to saturation the RF power amplifier can operate and still behave linearly once the predistortion coefficients are applied.

Recent digital predistortion relies on the fact that most RF power amplifiers have amplitude and phase characteristics that are phase invariant with respect to the input signal. This assumption allows the predistortion to be applied as a gain and phase multiplication to the input signal based only on its amplitude. It is important to note that proper operation of a predistortion linearizer in such a system is based also on an assumption that the amplifier is memoryless and that the signals are not filtered before the RF power amplifier.

However, an RF power amplifier exhibits memory effects when its output is a function of both current input and past inputs. Electrical memory effects are mainly caused by variation of component impedances in the modulation frequency bandwidth. Source and load impedances are frequency dependant and cannot be maintained constant over an entire band. Thus, the amplitude and phase of the inter-modulation products vary within the bandwidth. These memory effects particularly affect high-powered RF amplifiers.

One difficulty in compensating for memory effects is that the frequency behavior of the amplifier varies over time, depending on temperature, aging, etc.

SUMMARY OF THE EMBODIMENTS

A system of cascading a memory polynomial predistorter (MP DPD) for correcting memory effects and a look-up-table digital predistorter (LUT DPD) for correcting non-memory compression is provided (composite DPD). A method for training the separate MP correction and the LUT linearizing predistorters is also provided.

An RF power amplifier system including a composite DPD ensuring optimized linearity for the power amplifier is described. In this system, a digital-to-analog converter (DAC), an analog filter, a quadrature modulator, and the RF power amplifier are serially coupled to cascaded digital predistorters. A demodulator, a receive gain block, and an analog-to-digital converter (ADC) are serially coupled to the output of the power amplifier. A DPD training component is coupled between the inputs of the cascaded DPDs and the output of the power amplifier. The cascaded DPDs include a memory polynomial (MP) DPD, a look-up table (LUT) DPD, and two multiplexers. The MP DPD is configured to receive a digital input signal. The first multiplexer is configured to select either the input signal or the output of the MP DPD. The LUT DPD is configured to receive an output of the first multiplexer. The second multiplexer is configured to select either the output of the first multiplexer or the output of the LUT DPD. This combination of MP DPD, LUT DPD, and multiplexers forms a composite DPD.

A method of calibrating the composite DPD for the power amplifier is also described. In a first training session, both DPDs are bypassed and a narrowband transmit signal is provided to the RF power amplifier to train the look-up-table (LUT) DPD. Once trained, the LUT DPD is able to correct for high-order non-linearity without memory effect, thereby providing a memoryless correction for the RF power amplifier. In a second training session, the LUT DPD is included in the input path, and a wideband digital input signal is provided to the power amplifier to train the MP DPD. Once trained, the MP DPD can correct for residual memory non-linearity. Because the LUT DPD has corrected for the high-order non-linearity, the MP DPD needs only relatively low-order polynomials to provide its correction. After the MP DPD and the LUT DPD have been trained, the multiplexers can be configured to enable only the LUT DPD for narrowband signal transmission to the RF power amplifier and both the LUT DPD and the MP DPD for wideband signal transmission to the power amplifier.

DETAILED DESCRIPTION OF THE DRAWINGS

Figure 1:
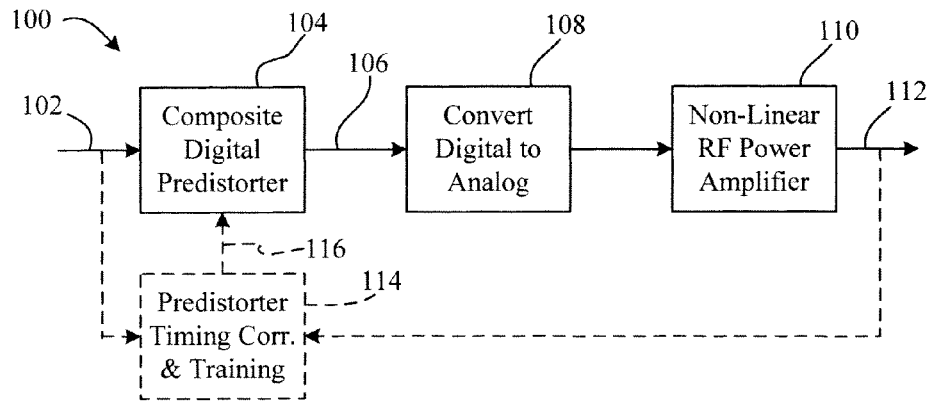
FIG. 1 illustrates an overview of an RF power amplifier system that includes a composite digital predistorter for linearizing an RF power amplifier and an adaptive-feedback component for training the predistorter.

In the drawing figures, like elements in the several figures are given the same reference numeral as an aid to understanding. For example, composite digital predistorter (DPD) 104 of FIG. 1 has an input line 102 and an output line 106. In FIG. 2 composite DPD 104 is shown in greater detail and includes input line 102 and output line 106. Similarly, in FIG. 3 composite DPD 104 is shown in even greater detail and includes input line 102 and output line 106.

One method of handling memory effects is to incorporate a correction for memory effects into the non-memory linearization predistortion. In some embodiments, a look-up-table (LUT) digital predistortion has the advantages of good improvement of linearity, is able to handle broadband signals, is stable, and is efficient to implement as nonlinear predistortion. Using an adaptive predistortion or PA character inversion, the look-up-table can be adapted or updated for an amplifier whose exact responses are unknown. However, memory effects may not be corrected using such solution.

Figure 2:
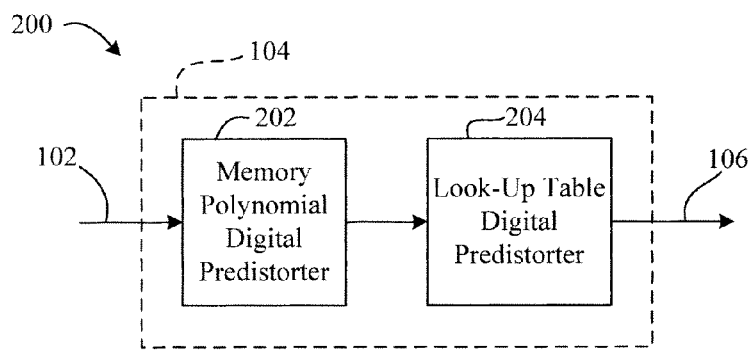
FIG. 2 illustrates the composite digital predistorter of FIG. 1 including a low-order memory polynomial digital predistorter cascaded with a high-order look-up-table digital predistorter to achieve a composite predistortion.

FIG. 1 illustrates an overview of an example RF power amplifier system 100 that includes a composite DPD 104 for linearizing a non-linear RF power amplifier 110, and also includes an adaptive-feedback component (predistorter timing correction and training) 114 for training composite DPD 104. A digital input signal is received at input 102 to composite DPD 104. A digital output signal 106 of composite DPD 104 is converted by convert-digital-to-analog component 108 to a quadrature-modulated RF analog signal for driving non-linear RF power amplifier 110.

During adaptive training of composite DPD 104, the predistorter timing correction and training component 114 receives feedback of the RF amplifier output signal from output line 112 via a feedback path (broken line) and also receives the digital input signal 102 of composite DPD 104. The training component 114 compares a delayed, synchronized input signal (102) of the composite DPD with a digitized, demodulated RF output signal of 112 and uses the comparison (e.g., a Least Squares (LS) training algorithm for MP DPD, and in another embodiment, a nonlinear function inversion for LUT DPD) to compute coefficients for composite DPD 104 during two training sessions.

FIG. 2 illustrates an example composite DPD 104 of FIG. 1 as a memory polynomial digital predistorter 202 serially cascaded with a look-up-table digital predistorter 204 to achieve a composite predistortion. In some embodiments, the polynomial for 202 is a low-order polynomial. The cascaded DPDs are designated generally by reference numeral 200 in FIG. 2, and are enclosed in a broken line corresponding to composite DPD 104 of FIG. 1.

Figure 3:
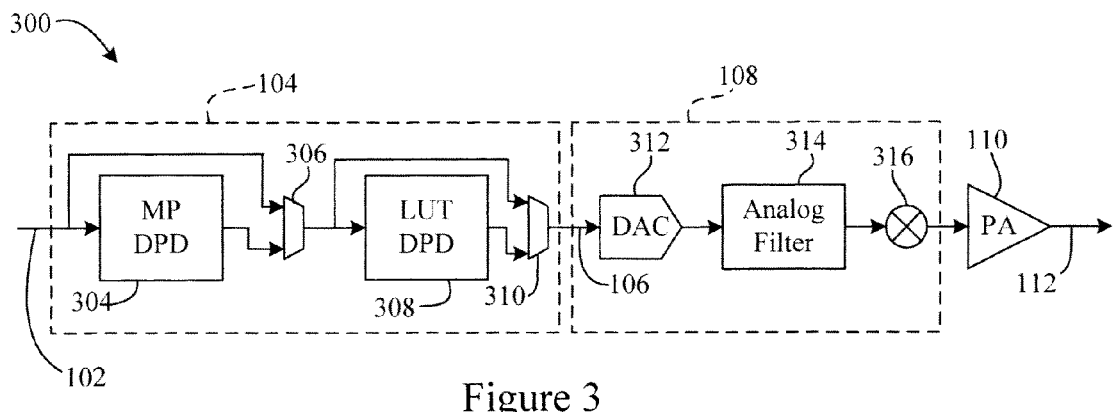
FIG. 3 illustrates the composite digital predistorter of FIG. 1, as used in a digital sub-system for wireless communication, driving a digital-to-analog converter, filter, and mixer/modulator for linearizing an RF power amplifier.

FIG. 3 illustrates the cascaded DPDs of an example composite DPD 104 of FIG. 2 in greater detail, including MP DPD 304 (202 of FIG. 2), LUT DPD 308 (204 of FIG. 2), and bypass multiplexers 306 and 310 (multiplexer control signals not illustrated). Digital output signal 106 of composite DPD 104 drives convert-digital-to-analog component 108, including a digital-to-analog converter 312, a pulse-shaping analog filter 314, and a quadrature modulator 316. The modulated RF output signal of component 108 drives non-linear RF power amplifier 110, which provides an amplified RF output signal at line 112. The circuit of FIG. 3 is designated generally by reference numeral 300.

Figure 4:
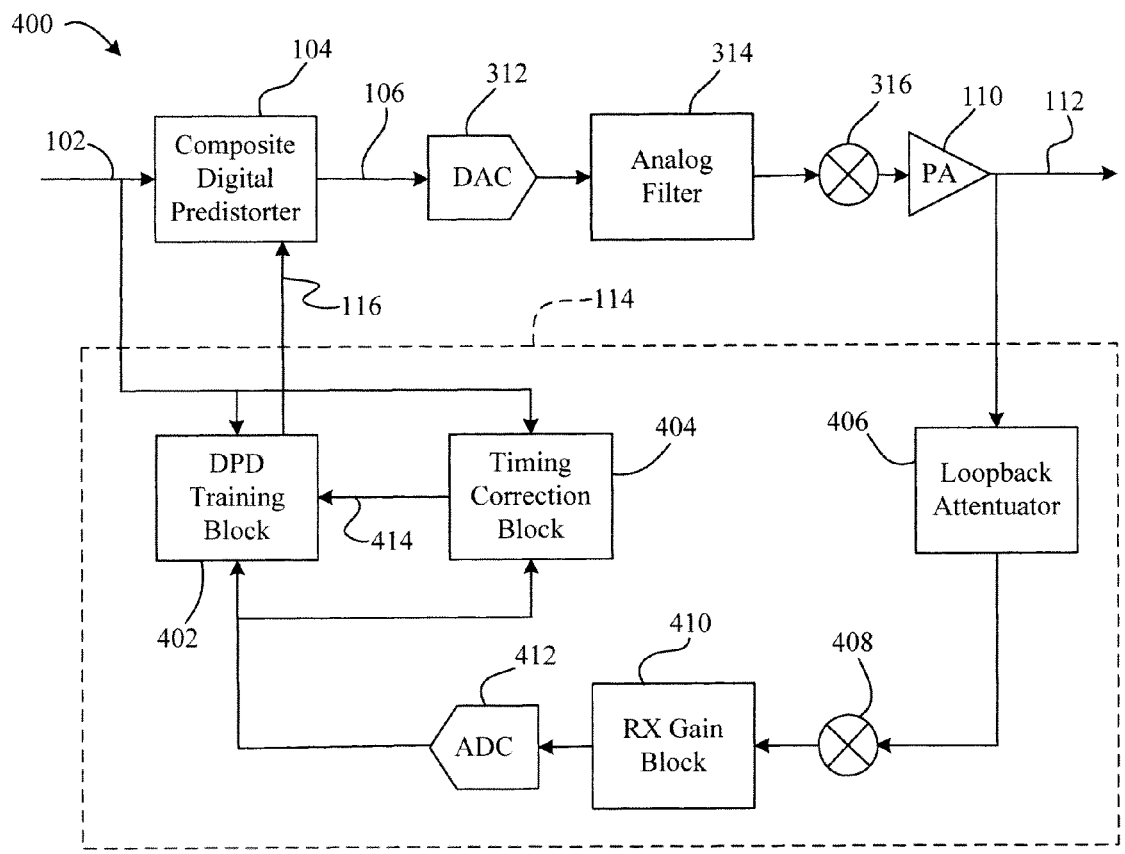
FIG. 4 illustrates exemplary functional blocks of a digital predistorter adaptive-feedback training component as illustrated in FIG. 1.

FIG. 4 illustrates exemplary functional blocks of an example digital predistorter adaptive-feedback training component 114, as illustrated in FIG. 1. Component 114 includes DPD training block 402, timing correction block 404, loopback attenuator 406, quadrature demodulator 408, RX gain block 410, and analog-to-digital converter (ADC) 412.

In some embodiments, the overall function of training component 114 is to compare a delayed digital input signal (102) of composite DPD 104 with a demodulated, digital form of the RF amplifier output signal (line 112) for determining coefficients of the look-up-table DPD and the memory polynomial DPD to match the characteristics of a specific power amplifier 110. To accomplish this result, the input (102) of composite DPD 104 may be delayed and synchronized by timing correction block 404 so that the delayed output (via delay index line 414) is temporally aligned and compared with a corresponding output of analog-to-digital converter (ADC) 412. The comparison is made by DPD training block 402 and the results of the comparison are used to determine the coefficients for the look-up-table of LUT DPD (204 of FIG. 2, and 308 of FIG. 3) and of the low-order memory polynomial for MP DPD 202, 304. In some embodiments, the training calibrates the sub-system located between the input signal (102) and the amplified RF output signal (112) by determining DPD 104 coefficients that improve linearity of the sub-system and reduce its memory effects.

The training component 114 receives input from line 102 and line 112. The training component 114 provides coefficients via line 116 for the memory polynomial and look-up-table DPDs of composite DPD 104. These coefficients control the predistortions of composite DPD 104. In some embodiments, the composite DPD includes a programmable structure and has a fixed architecture controllable by the coefficients provided via line 114. The coefficient values for the MP DPD and the LUT DPD can be initialized and then adjusted during training to optimize the predistortions of the composite DPD according to the individual characteristics of a given power amplifier 110. In some embodiments, portions of the training component 114 may be implemented using one or more digital signal processors (DSP) or other programmable computing devices.

In an embodiment, an LS algorithm is employed by DPD training block 402 to compute the coefficients of a polynomial expression of LUT DPD 204/308. In another embodiment, training block 402 implements a function inversion to determine the memoryless LUT coefficients. In another embodiment, AM/AM and AM/PM performance curves are determined and then X and Y axes of the curves are transposed to derive inversion curves for use with the LUT DPD 204/308. These methods might not involve iteration. One of the advantages provided by no iteration is a faster solution time for coefficient determination than an iterative method. When the LUT DPD is referred to as "memoryless," it means that the LUT DPD does not correct for memory effects.

Figure 5:
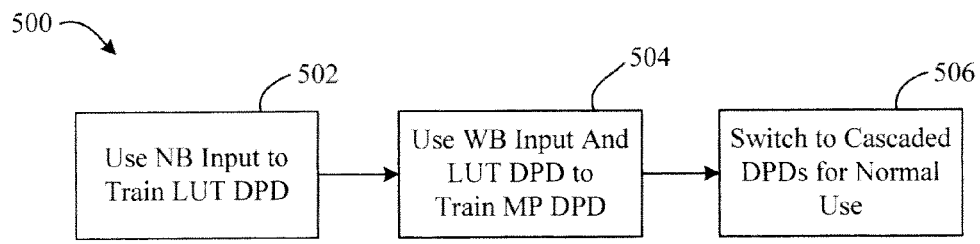
FIG. 5 illustrates an exemplary method for training the composite digital predistorter, such as illustrated in FIGS. 1-4.

In some embodiments, some or all of components 104, 108 and 114 (FIG. 1) are incorporated into one or more integrated circuits including one or both of digital and analog portions, forming a trainable digital predistortion sub-system. In some embodiments, the RF power amplifier 110 is implemented separately. However, it should be understood that other embodiments may allow the use of logic outside of ICs FIG. 5 illustrates an exemplary method 500 for training a composite digital predistorter such as illustrated in FIGS. 1-4. Training of the composite DPD 104 may involve selective use of the multiplexers 306 and 310 of FIG. 3 (multiplexer control signals not illustrated). An understanding of the operation of the multiplexers during composite DPD training will be made easier with reference to the illustrations of FIGS. 6A, 6B, and 6C in which the active signal path through composite DPD 104 is emphasized by use of a heavy line. Temporarily inactive paths and components of composite DPD 104 are shown with lightly dashed lines. Thus, in FIG. 6A, the active signal path bypasses both MP DPD 304 and LUT DPD 308. In FIG. 6B the active path bypasses MP DPD 304, but includes LUT DPD 308. In FIG. 6C, the active path includes both MP DPD 304 and LUT DPD 308.

In some embodiments, two steps are taken in calibrating and correcting a nonlinear power amplifier (PA) with memory effect. The first step is to correct the memoryless nonlinearity using a LUT based structure. As an advantageous result of the flexibility of the LUT method, it can correct high-order nonlinearity without limitation of polynomial orders. After the LUT calibration, the trained LUT predistorter (FIG. 6B) is applied together with the PA, resulting in an integrated (coarse-corrected) PA. The second step is to use the MP scheme on the coarse-corrected PA to further combat the residual memory nonlinearity.

Because the high-order nonlinearity has been reduced by the LUT predistorter, relatively lower-order polynomials in the MP correction step may be sufficient. The MP predistorter does not need to be constrained by having the same polynomial order structures for different memory delays. As an example, to support three-memory-delay predistortion, the predistortion polynomials for three delays can take the orders of 7, 5, and 3 respectively. Also the MP predistorter does not need to be constrained by equal delay spacing between adjacent memory taps. It can be any format of memory-based DPD cascaded with a nonlinearity-reduced memory PA system. In other embodiments, other kinds of memory-based DPD can be used. One example is a DPD based on a nonlinear auto-regressive moving average (NARMA) structure.

Figure 6A:
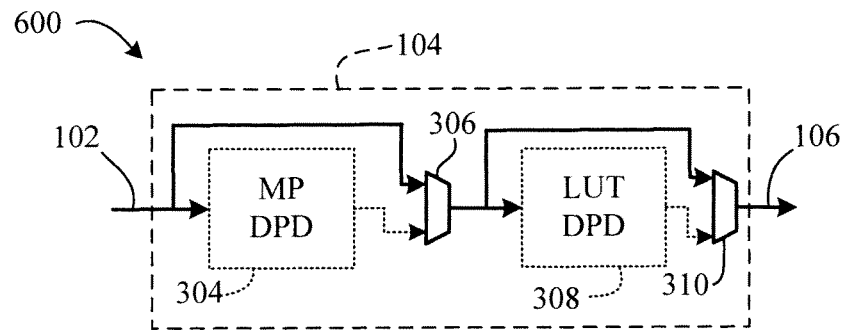
FIGS. 6A, 6B, and 6C illustrate connection configurations of the low-order memory polynomial and the high-order look-up-table digital predistorters at progressive phases of an exemplary training session.
Figure 6B:
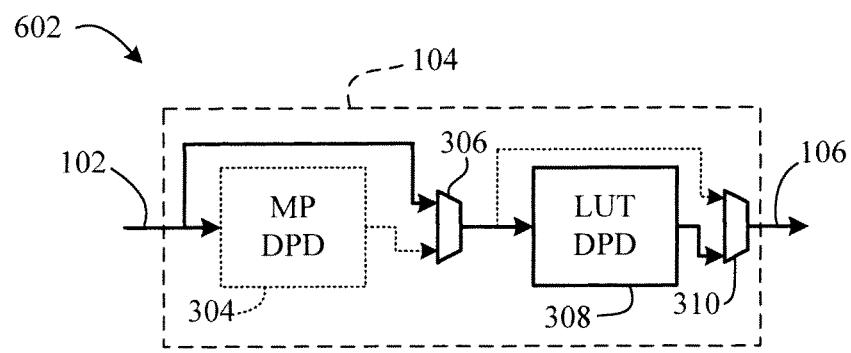
Figure 6C:
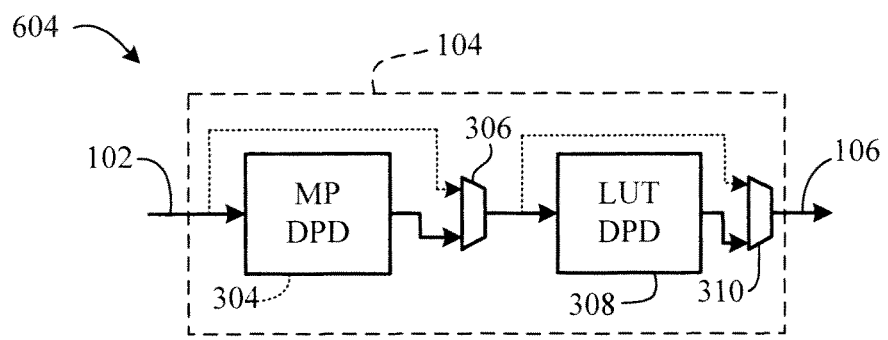

In the example method in FIG. 5, during a first training session 502, multiplexers 306, 310 of FIG. 3 are controlled to bypass the two predistorters 304, 308, and to select the input signal 102 as composite DPD output on line 106, as shown in FIG. 6A. During this first training session, a narrowband signal is applied at input 102 and coefficients for the LUT DPD 308 are computed to create an inverse of the memoryless saturation compression characteristics of power amplifier 110. It will be appreciated that different power amplifiers and power amplifiers for different applications may exhibit unique compression characteristics, and that the coefficients may be adjusted to compensate, to the extent possible, for the compression, resulting in a more linear amplifier response. At the completion of the LUT DPD training session, the method advances to a second training session 504.

During the second training session 504, multiplexers 306, 310 are controlled to bypass the MP DPD 304 but to include the trained LUT DPD 308 in the input path, as illustrated in FIG. 6B. A wideband input signal is applied to input 102 and is predistorted by trained LUT DPD 308 to provide a composite DPD output at line 106. During this second training session, the trained, memoryless DPD 308, block 108, and PA 110 are considered together as the target PA system for the memory based MP DPD training. Such a target PA system will in general have less nonlinearity than typical PAs because of the applied LUT DPD correction. A wideband input signal may be used to train and compute coefficients for the MP DPD 304 during the second training session. The reduced nonlinearity of the target PA system makes the second stage MP DPD easier to implement. This result is in contrast to the inherent difficulty of training a single, combined memory and memoryless predistorter, as was mentioned earlier.

Finally, at 506, the multiplexers 306, 310 are controlled to include both MP DPD 304 and LUT DPD 308 in the input path, as illustrated in FIG. 6C. This is the configuration that is used in normal operation for narrowband/wideband input signals.

In an embodiment, when the input at line 102 is limited to a narrow band signal, the MP DPD 304 can be bypassed so that only the LUT DPD 308 is in the signal path, as illustrated in FIG. 6B. When the input includes wideband signals, the composite DPD 104 can include both the MP DPD 304 and the LUT DPD 308, as illustrated in FIG. 6C.

In one embodiment, considering a memoryless, linearizing DPD (204/308) to be an "inner" DPD, and a memory-effects DPD (202/304) to be an "outer" DPD, and the convert-digital-to-analog element 108 and the PA 110 to be a "target," then a first phase of training computes coefficients for the "inner" DPD using a narrow-band input training signal, while a second phase of training computes coefficients for the "outer" DPD using a wide-band input training signal and combining the "inner" DPD and the "target." When viewed this way, a number of algorithms known in the art can be used to compute the necessary coefficients for both the "inner" and the "outer" DPDs.

Certain aspects of the composite DPD training method 500, as illustrated in FIG. 5, may take the form of an entirely software embodiment (including firmware, resident software, micro-code, etc.) or an embodiment combining software and hardware aspects that may all generally be referred to herein as a "circuit," "module" or "system." Furthermore, embodiments of the disclosure may take the form of a computer program product embodied in any tangible medium of expression having computer usable program code embodied in the medium. The described embodiments may be provided as a computer program product, or software, that may include a machine-readable medium having stored thereon instructions, which may be used to program a computer system (or other electronic device(s)) to perform a process according to embodiments, whether presently described or not. A machine-readable medium includes any mechanism for storing ("machine-readable storage medium") or transmitting ("machine-readable signal medium") information in a form (e.g., software, processing application) readable by a machine (e.g., a computer). The machine-readable storage medium may include, but is not limited to, magnetic storage medium (e.g., floppy diskette), optical storage medium (e.g., CD-ROM), magneto-optical storage medium, read only memory (ROM), random access memory (RAM), erasable programmable memory (e.g., EPROM and EEPROM), flash memory, or other types of medium suitable for storing electronic instructions (e.g., executable by one or more processing units). In addition, machine-readable signal medium embodiments may be embodied in an electrical, optical, acoustical, or other form of propagated signal (e.g., carrier waves, infrared signals, digital signals, etc.), or wireline, wireless, or other communications medium.

Computer program code for carrying out operations of the embodiments may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN), a personal area network (PAN), or a wide area network (WAN), or the connection may be made to an external computer (for example, through the Internet using an Internet Service Provider).

The above description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. A method of calibrating a composite digital predistorter (DPD) for an RF power amplifier, the method comprising:
   in a first training session, bypassing the composite DPD and applying a narrowband transmit signal to the RF power amplifier to train a memoryless-linearizing element of the composite DPD;
   in a second training session, bypassing a memory-effects-reducing element of the composite DPD, applying a wideband transmit signal, predistorted by the trained memoryless-linearizing element, to the RF power amplifier to train the memory-effects-reducing element of the composite DPD;
   for wideband signal transmission, including the trained memory-effects-reducing element cascaded through the trained memoryless-linearizing element for composite predistortion; and
   for narrowband signal transmission, bypassing the trained memory-effects-reducing element and including the trained memoryless-linearizing element for predistortion.

2. The method of claim 1, wherein the memoryless-linearizing element is trained using one of a least-squares (LS) training algorithm and a nonlinear function inversion.

3. The method of claim 1, wherein the memory-effects-reducing element is trained using a least-squares (LS) training algorithm.

4. The method of claim 1, wherein the memoryless-linearizing element further comprises a look-up table (LUT) DPD.

5. The method of claim 1, wherein the memory-effects-reducing element further comprises a memory polynomial (MP) DPD.

6. A non-transitory, computer-readable medium storing computer-executable instructions for providing calibration of a composite digital predistorter (DPD), the instructions when executed by a processor-controlled power amplifier system including a composite DPD cause the processor-controlled system to execute a process comprising:
   in a first training session, bypassing the composite DPD and applying a narrowband transmit signal to the power amplifier system to train a memoryless-linearizing element of the composite DPD;
   in a second training session, bypassing a memory-effects-reducing element of the composite DPD, applying a wideband transmit signal, predistorted by the trained memoryless-linearizing element, to the power amplifier system to train the memory-effects-reducing element of the composite DPD;
   for wideband signal transmission, including the trained memory-effects-reducing element cascaded through the trained memoryless-linearizing element for composite predistortion; and
   for narrowband signal transmission, bypassing the trained memory-effects-reducing element and including the trained memoryless-linearizing element for predistortion.

7. An RF power amplifier system comprising:
   a composite digital predistorter (DPD) to receive a digital input signal, and further comprising a first DPD for correcting RF power amplifier memory effects, driving a second DPD for correcting RF power amplifier memoryless saturation-compression distortion effects;
   a digital-to-analog conversion component to receive an output of the composite DPD for modulating an RF carrier frequency;
   a non-linear RF power amplifier to receive the modulated RF carrier frequency and to provide an amplified RF output signal; and
   a training component to receive the amplified RF output signal and the digital input signal, and during a first training session, receiving a narrow band digital input signal and bypassing the composite DPD for training the second DPD, and during a second training session, bypassing the first DPD, and receiving a wideband digital input signal for training the first DPD.

8. The system of claim 7, wherein the first DPD comprises a trainable low-order memory polynomial (MP) DPD having coefficients trained to correct RF power amplifier memory effects.

9. The system of claim 7, wherein the second DPD comprises a trainable look-up-table (LUT) DPD having coefficients trained to correct higher-order RF power amplifier memoryless saturation-compression effects.

10. The system of claim 7, wherein the first DPD and its coefficients are distinct from the second DPD and its coefficients.

11. The system of claim 10, wherein the composite DPD further comprises:
    a first multiplexer to receive the digital input signal, an output of the first DPD, and a first control signal; and
    a second multiplexer to receive an output of the first multiplexer, an output of the second DPD, and a second control signal, and provide an output of the composite DPD.

12. The system of claim 11, further comprising an at least one bypass controlled by at least one of the first and second control signals to bypass both the first DPD and the second DPD so that the digital input signal provides the output of the composite DPD.

13. The system of claim 11, further comprising an at least one bypass controlled by at least one of the first and second control signals to bypass the first DPD so that the digital input signal predistorted by the second DPD provides the output of the composite DPD.

14. The system of claim 7, wherein the digital-to-analog conversion component further comprises:
    a digital-to-analog converter (DAC) to receive the output of the composite DPD;
    an analog filter to receive an output of the DAC; and
    a quadrature modulator to receive the output of the analog filter and the RF carrier frequency, for modulating the RF carrier frequency with the output of the analog filter, and for providing the modulated RF carrier frequency.

15. The system of claim 7, wherein the training component further comprises:
    a loopback attenuator connected to receive and attenuate the amplified RF output signal;
    a mixer to receive the attenuated amplified RF output signal and to provide a demodulated analog signal;
    an RX gain block to receive the demodulated analog signal and to adjust its amplitude for further processing;
    an analog-to-digital converter (ADC) to receive the gain-adjusted demodulated analog signal and to produce a digital equivalent of the gain-adjusted demodulated analog signal;

a timing correction block for delaying and synchronizing the digital input signal for comparison with the digital equivalent of the gain-adjusted demodulated analog signal; and a DPD training block for using an output of the timing correction block and an output of the analog-to-digital converter for training the composite DPD.

16. An RF power amplifier predistortion and training subsystem, comprising:

a composite digital predistortion (DPD) means for:

predistorting a digital input signal using a memory-effects-reducing function having coefficients determined during a memory-effects (ME) training phase to provide a first signal, and predistorting the first signal using a memoryless-linearizing function having coefficients determined during a memoryless-linearizing training phase to provide a second signal;

a digital-to-analog conversion and a quadrature modulation means for:

receiving the second signal and converting the second signal to an analog signal; and using the analog signal to quadrature-modulate a carrier frequency to provide a modulated RF signal; and a feedback-adaptive timing correction and training means for:

receiving the digital input signal and an RF output signal, delaying the digital input signal for comparison with a demodulated and digitized RF output signal for adaptively determining the coefficients, and during the memoryless-linearizing training phase:

bypassing the composite DPD means for receiving a narrow band digital input signal as the second signal, and training the memoryless-linearizing function by determining its coefficients, and during the memory-effects-reducing training phase, using the trained memoryless-linearizing function for predistorting a wide band digital input signal for providing the second signal, and training the memory-effects-reducing function by determining its coefficients.

17. The sub-system of claim 16, implemented as an at least one integrated circuit.

18. The sub-system of claim 17, wherein the at least one integrated circuit comprises at least one digital signal processing (DSP) means.

19. The sub-system of claim 16, further comprising an RF power amplifier connected to receive the modulated RF signal, and providing the RF output signal.

20. The sub-system of claim 16, further comprising an operational phase that selectively bypasses the memory-effects-reducing function when the digital input signal is a narrow band signal, and cascades the memory-effects-reducing function and the memoryless-linearizing function when the digital input signal is a wide band signal.

21. A signal processing method, comprising:

distorting a digital input signal using a composite digital predistorter (DPD) wherein distorting the digital input signal comprises:

distorting the digital input signal using a memory polynomial (MP) DPD if the digital input signal is a wideband digital input signal and correcting power amplifier memory effects where memoryless saturation compression non-linearity has been independently corrected;

receiving an output of the MP DPD using a look-up-table (LUT) DPD and independently correcting memoryless saturation compression non-linearity of the power amplifier and providing an output of the composite DPD; and bypassing the MP DPD if the digital input signal is a narrow band digital input signal;

converting the distorted digital input signal to a distorted, filtered, modulated RF signal using a digital-to-analog converter, filter, quadrature-modulator combination; and amplifying the distorted, filtered modulated RF signal using an RF power amplifier to provide an amplified RF output signal.

22. The signal processing method of claim 21, further comprising using the amplified RF output signal and the digital input signal to train the composite DPD.

23. The signal processing method of claim 22, wherein using the amplified RF output signal and the digital input signal to train the composite DPD further comprises:

attenuating the signal strength of the amplified RF output signal;

converting the attenuated amplified RF output signal to a digital feedback signal using a mixer-gain control-analog-to-digital converter combination;

comparing the digital feedback signal with a time-corrected distorted digital input signal; and using a result of the comparison for training the composite DPD.

24. The signal processing method of claim 23, wherein training the composite DPD further comprises:

in a first phase, applying a narrow band digital input signal directly to the digital-to-analog converter, filter, quadrature-modulator combination and using a resulting digital feedback signal to train the look-up-table LUT DPD; and in a second phase, applying a wideband digital input signal directly to the trained LUT DPD whose output is connected to drive the digital-to-analog converter, filter, quadrature-modulator combination and using a resulting digital feedback signal to train the MP DPD.

25. A composite digital predistorter (DPD), comprising:

a memory polynomial (MP) digital predistortion means for receiving a digital input signal and for correcting power amplifier memory effects where memoryless saturation compression non-linearity has been independently corrected; and a look-up-table (LUT) digital predistortion means for receiving an output of the MP digital predistortion means and for independently correcting memoryless saturation compression non-linearity of a power amplifier and providing an output of the composite DPD and a MP bypass means for bypassing the MP digital predistortion means for use with narrow band digital input signals.

* * * * *